(12) United States Patent
Lin et al.

(10) Patent No.: US 6,543,980 B2
(45) Date of Patent: Apr. 8, 2003

(54) TEACHING TOOL FOR A ROBOT ARM FOR WAFER REACTION OVENS

(75) Inventors: Hsien Hsiang Lin, Kaohsiung (TW); Thanku Shieh, Kaohsiung (TW); Wen-Ching Wu, Hsinchu (TW); Hsiao-Ping Hsieh, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/863,329

(22) Filed: May 24, 2001

(65) Prior Publication Data

US 2002/0076305 A1 Jun. 20, 2002

(30) Foreign Application Priority Data

Dec. 15, 2000 (TW) .......................................... 89221842

(51) Int. Cl.7 .............................................. G11B 15/68
(52) U.S. Cl. ...................................... 414/160; 414/787
(58) Field of Search ............................ 901/30, 47, 50, 901/3, 4; 414/160, 432, 787

(56) References Cited

U.S. PATENT DOCUMENTS

| | | | | |
|---|---|---|---|---|
| 4,581,566 A | * | 4/1986 | Ekstrom et al. ....... 318/568.14 |
| 4,702,665 A | * | 10/1987 | Nakashima et al. ......... 414/730 |
| 4,813,844 A | * | 3/1989 | Torii et al. .................. 414/730 |
| 5,438,418 A | * | 8/1995 | Fukui et al. ................. 356/399 |
| 5,743,916 A | * | 4/1998 | Greenberg et al. .......... 606/102 |
| 5,822,498 A | * | 10/1998 | Kumasaka et al. ..... 318/568.13 |
| 6,153,999 A | * | 11/2000 | Borrego ..................... 318/561 |
| 6,300,644 B1 | * | 10/2001 | Beckhart et al. ....... 250/559.33 |

* cited by examiner

*Primary Examiner*—Eileen D. Lillis
*Assistant Examiner*—Charles Fox
(74) *Attorney, Agent, or Firm*—Bacon & Thomas, PLLC

(57) ABSTRACT

A teaching tool for a robot arm for wafer reaction ovens is provided to anchor the robot arm with respect to a tray located inside a reaction oven. The teaching tool provides an upper flange for maintaining a spacing between a handle of the robot arm and a door of the oven, a position width for keeping the teaching tool aligning with a center line of the tray, and a lower tunnel aligning with the center line for allowing a blade of the robot arm to contact closely and horizontally from a lower position and thus for maintaining a position height between the blade and a floor of the reaction oven. By providing the teaching tool, easy blind calibration with multiple contact points between the robot arm and the oven can be performed so that possible efficiency down and cost up from an ill-calibration can be reduced to a minimum.

7 Claims, 3 Drawing Sheets

TEACHING TOOL FOR A ROBOT ARM FOR WAFER REACTION OVENS

BACKGROUND OF THE INVENTION (1) Field of the Invention

The invention relates to a teaching tool for a robot arm for wafer reaction ovens, and more particularly to a block gauge which provides multiple contact points to blind calibrate a correct position of a robot arm in a sealed wafer reaction oven.

(2) Description of the Prior Art

While utilizing a sealed wafer oven or chamber in the wafer-manufacturing industry, a robot arm is usually applied to handle wafers into or out of the oven through an openable door of the oven. Referring now to FIG. 1 and FIG. 2, a transverse-sectional top view and a cross-sectional side view are shown respectively for a robot arm 2 located at a correct position, or say an anchoring position, in a wafer reaction oven 1. As shown, a wafer 3 is carried by a blade 21 of the robot arm 2 and it can be seen that the only passage for the robot arm 2 to enter or leave the oven 1 is a door 10 of the oven 1.

As illustrated in FIG. 2, it is clear that the wafer 3 is handled by the blade 21 of the robot arm 2 from a lower position (negative z axis direction). From FIG. 1, the wafer 3 in the oven 1 is rested upon an imaged surface formed by a plurality of pins 41 extruding from the tray 4 and also toward a center of the tray 4. In the operation of the oven 1, the anchoring position for the wafer 3 in the oven is essentially important. For any deviation of the wafer 3 away from the anchoring position, manufacturing defects in wafer uniformity are quite possible, and also possible collisions with the oven 1 during the wafer's moving can be foreseen. It is obvious that both types of aforesaid situations will definitely lead to a lower yield of the wafer manufacturing process in the oven 1.

To avoid any possible deviation of the wafer 3, a calibration upon the robot arm 2 with respect to the tray 4 is required. Referring to FIG. 1 and FIG. 2, the correct relationship including the anchoring position among the robot arm 2, the wafer 3, the tray 4 and the oven 1 is shown. As shown, while the robot arm 2 holding a wafer 3 right at the anchoring position, a front edge 201 of a handle 20 of the robot arm 2 spaces a distance W to the door 10 of the oven 1, and an upper edge 211 of the blade 21 of the robot arm 2 spaces a distance h to a floor 221 inside the oven 1. Also in the correct relationship, the blade 21 of the robot arm 2 is located along a center line LL of the tray 4 and is held horizontally.

After a maintenance upon the robot arm 2 or any component of the oven 1, a calibration of the robot arm 2 with respect to the tray 4 for the wafer 3 reaching the anchoring position inside the oven 1 is required. Thereby, reference coordinate data about the anchoring position can be provided to a control system for coordinating the moving of the robot arm 2 in the following operation. In the art of the calibration upon such ovens, a calibration process or so-called a teaching process includes a step of retrieving the tray 4 from the oven 1, a step of placing a wafer 3 onto the anchoring position on the imaged surface formed by the pins 41 of the tray 4, a step of relocating the tray 4 as well as the wafer 3 into the oven 1, a step of moving the blade 21 of the robot arm 2 to the anchoring position under the wafer 3, and a step of the control system recording the coordinates of the blade 21.

However, in the calibration of the conventional robot arm 2, because the oven 1 is not disassembled at the same time, the only means that an operator can utilize to observe the position relationship inside the oven 1 is the door 10 of the oven 1. Though an electric torch can be used to help the eye-sight, yet the anchoring position of the wafer 3 is deep inside the oven 1 so that vision difficulty during the calibration can be expected. Therefore, a second calibration upon the robot arm 2 is usually needed after a short time of normal operation by investigating the wafer 3 quality produced from the oven 1.

Apparently, too many uncertainties exist in the aforesaid traditional calibration method of the robot arm 2. Definitely, if any inaccuracy occurs during the calibration, following wafer manufacturing process will be affected and thus lead to a cost hike in material preparation.

SUMMARY OF THE INVENTION

Accordingly, it is a primary object of the present invention to provide a teaching tool for a robot arm for wafer reaction ovens, by which multiple contact points can be provided to blind calibrate the correct position of the robot arm in a sealed wafer reaction oven so as to avoid possible yield reduction and cost up from an ill-calibration.

The teaching tool for a robot arm for wafer reaction ovens in accordance with the present invention is formed as a unique piece for being applied to anchor a robot arm with a blade with respect to a tray located inside a reaction oven. While in calibrating, the teaching tool is placed at an upper conjunction between a handle of the robot arm and the blade, and then the teaching tool as well as the robot arm can be fed to the reaction oven through a door of the reaction oven by allowing a portion of the teaching tool and the blade to reach an anchoring position inside the reaction oven. In the present invention, the teaching tool is to perform a stop structure for maintaining a correct position relationship among the reaction oven, the tray and the robot arm.

In accordance with the present invention, the teaching tool is characterized on that: the teaching tool provides thereof an upper flange for maintaining a spacing between the handle and the door, the teaching tool provides thereof a position width for keeping the teaching tool aligning with a center line of the tray by plugging a central passage of the tray, and the teaching tool further comprises thereof a lower tunnel aligning with the center line for allowing the blade to contact closely and horizontally therefrombelow and thus for maintaining a position height between the blade and a floor of the reaction oven.

In one embodiment of the present invention, the lower tunnel of the teaching tool can be complementary in shape to the blade at said upper conjunction.

In one embodiment of the present invention, the teaching tool can be shaped as a block gauge.

In one embodiment of the present invention, the portion of the teaching tool that enters the reaction oven while in calibrating can have a height just to plug the door of the reaction oven.

In one embodiment of the present invention, the upper flange and the handle can be surface-contacted, i.e. surface-to-surface contacted, and also the upper flange and the door can be also surface-contacted.

In one embodiment of the present invention, the teaching tool and the central passage of the tray can be surface-contacted for maintaining the position width.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
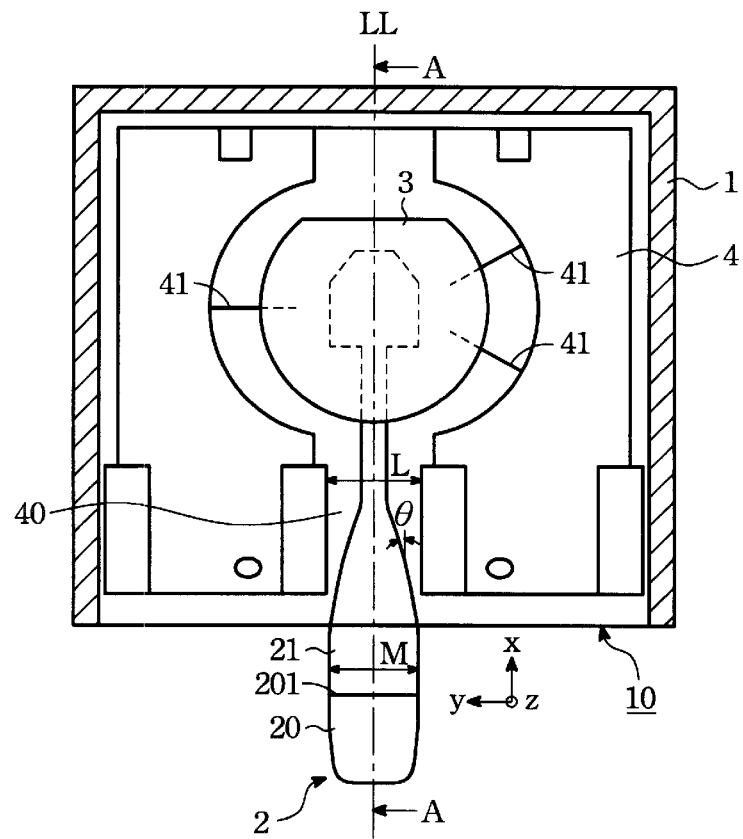
FIG. 1 is a transverse-sectional top view to show the position relationship between a robot arm and a wafer reaction oven at an anchoring position.

The invention disclosed herein is directed to a teaching tool for a robot arm for wafer reaction ovens. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Referring back to FIG. 1 and FIG. 2, it can be understood that a suitable teaching tool or a calibration tool for the robot arm 2 should meet the following criteria.

1. While in calibration, the teaching tool can maintain a W spacing between the front edge 201 of the handle 20 of the robot arm 2 and the door 10 of the reaction oven 1.
2. While in calibration, the teaching tool can maintain an h spacing between the upper edge 211 of the blade 21 of the robot arm 2 and the interior floor 221 of the reaction oven 1.
3. While in calibration, the teaching tool can align the blade 21 of the robot arm 2 along with the center line LL of the tray 4.
4. While in calibration, the teaching tool can keep the blade 21 of the robot arm 2 at a horizontal position; i.e., the upper edge 211 of the blade 21 can be maintained horizontally.

Figure 2:
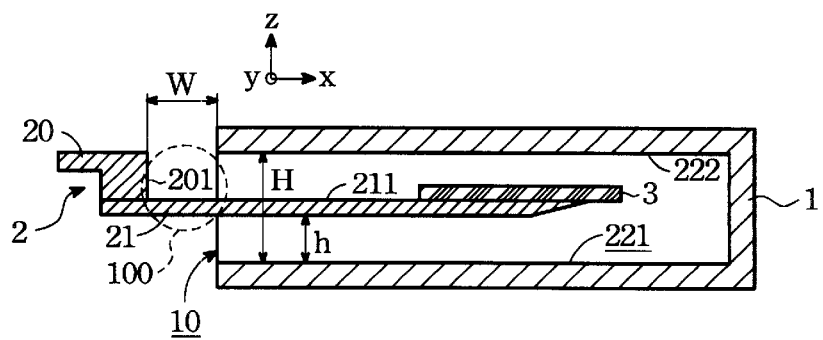
FIG. 2 is a cross-sectional view of FIG. 1 along line AA.

By investigating the anchoring position shown in FIG. 1 and FIG. 2, it is found that those position references with sufficient strength in the reaction oven 1 include the front edge 201 of the handle 20 of the robot arm 2, the upper edge 211 of the blade 21 of the robot arm 2, the door 10 of the reaction oven 1, inner walls of the reaction oven 1 including the floor 221, and the central passage 40 of the tray 4 for receiving the robot arm 2. Based on the position references, the teaching tool for a robot arm 2 for wafer reaction ovens 1 in accordance with the present invention can be designed.

Figure 3:
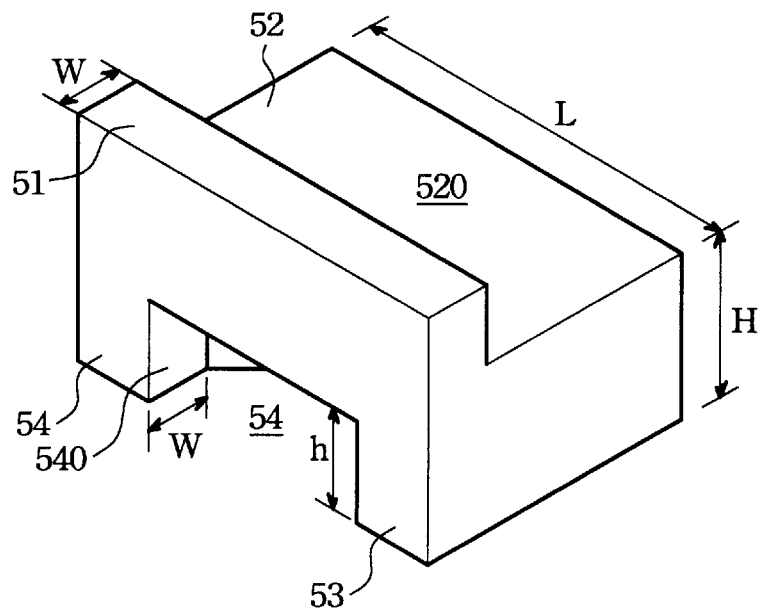
FIG. 3 is a perspective view of a preferred teaching tool for a robot arm for wafer reaction ovens in accordance with the present invention.
Figure 4:
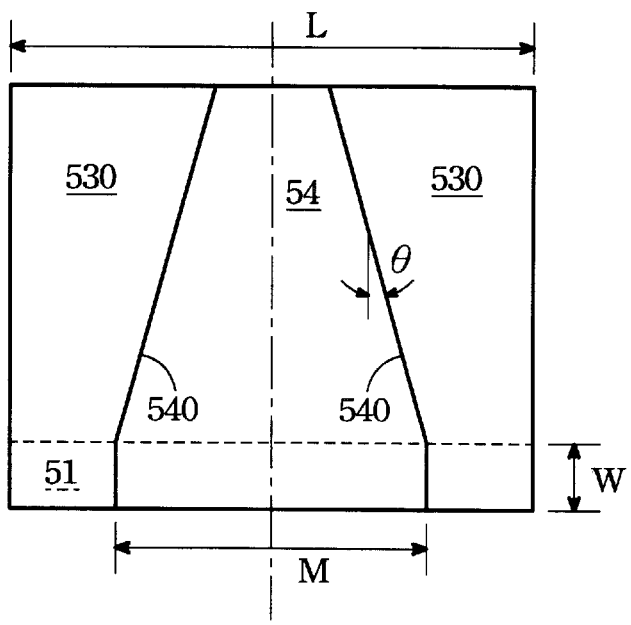
FIG. 4 is a bottom view of FIG. 3.

Referring now to FIG. 3 and FIG. 4 (also looking back to FIG. 1 and FIG. 2), a perspective view and a bottom view of a preferred teaching tool 5 for a robot arm for wafer reaction ovens are shown, respectively. As shown, the teaching tool 5 is preferably formed as a unique piece, i.e. as a block gauge. One of many characteristics of the teaching tool 5 is that the teaching tool 5 includes an upper flange 51 for maintaining the spacing W between the front edge 201 of the handle 20 of the robot arm 2 and the door 10 of the reaction oven 1. The upper flange 51 can be formed by any proper profile. Preferably, the upper flange 51 has a rectangular cross section whose width is equal to the spacing W.

In the present invention, another characteristics is that the teaching tool 5 includes an insert block 52 for providing a position width L to plug the central passage 40 of the tray 4 while in calibration. Thereby, the teaching tool 5 can align its center line with the center line LL of the tray 4. Of course, in another embodiment of the present invention, the teaching tool 5 can apply inner walls of the reaction oven 1 to align the center lines LL of the teaching tool 5 and the tray 4. Yet, in such an embodiment, the volume of the teaching tool 5 can be too big to be easily operated. In addition, in the case that the center line LL of the tray 4 is not aligned with a center line of the reaction oven 1, the robot arm 2 calibrated by means of the inner walls of the reaction oven 1 will definitely cause problems in following manufacturing processes.

In the present invention, one more characteristics is that the teaching tool 5 further includes a pair of lower flanges 53 for forming in between a lower tunnel 54 lying along with the center line of the teaching tool 5. The lower tunnel 54 can allow the blade 21 of the robot arm 2 to contact therewith closely from a lower position and thus, while in calibration, to maintain a position height h between the blade 21 and the floor 221 of the reaction oven 1. Furthermore, by providing a close contact with the tunnel surface 540 of the lower tunnel 54, the blade 21 can be kept horizontally.

As shown, the profile (i.e. the tunnel surface 540) of lower tunnel 54 of the teaching tool 5 in accordance with the present invention is preferably complementary in shape to the blade 21 of the robot arm 2 at the upper conjunction 100, for facilitating the application of the teaching tool 5 onto the robot arm 2.

Refer to the preferred embodiment of the teaching tool 5 as shown in FIG. 3 and FIG. 4. The height of the insert block 52 is just equal to the height H of the interior room of the reaction oven 1, i.e. the distance measured from the floor 221 to the ceiling 222, so that the insert block 52 can plug the reaction oven 1 during the calibration. In another embodiment not shown in figures, the height of the blade 21 of the robot arm 2 can also be calibrated by reference to either the ceiling 222 or the floor 221. While the blade 21 is calibrated through the ceiling 222 of the reaction oven 1, contact between the lower flanges 53 of the teaching tool 5 and the floor 221 of the reaction oven 1 is no more required during the calibration. On the other hand, while the blade 21 is calibrated through the floor 221, contact between the top surface 520 of the insert block 52 and the ceiling 222 is no more required during the calibration.

Preferably, in the present invention, the upper flange 51, the insert block 52 and the lower tunnel 54 of the teaching tool 5 are surface-contacted, i.e. surface-to-surface contacted, with the handle 20 of the robot arm 2, the tray 4 and the door 10, respectively.

Figure 5:
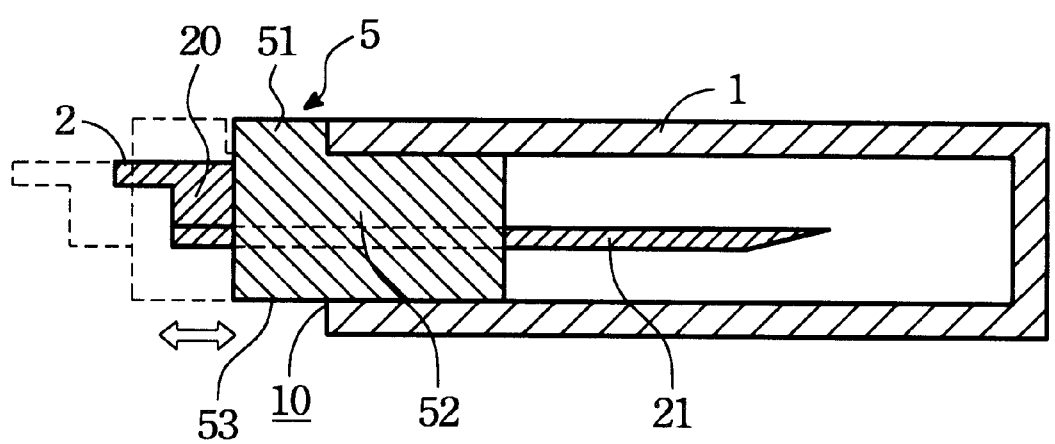
FIG. 5 is a cross-sectional view to show the preferred teaching tool in calibration.

Referring now to FIG. 5 (also with reference to FIG. 1 through FIG. 4), a cross sectional view of the teaching tool 5, the robot arm 2 and the reaction oven 1 at the anchoring position is shown to illustrate the application of the present invention. Before using the teaching tool 5 in calibrating or teaching the robot arm 2, the position of the tray 4 inside the reaction oven 1 needs to be assured in advance. Then, the teaching tool 5 is placed to rest at the upper conjunction 100 between the handle 20 of the robot arm 2 and the blade 21, and thereafter the teaching tool 5 as well as the robot arm 2 can be fed to the reaction oven 1 through the door 10 by allowing a portion of the teaching tool 5 (i.e. the insert block 52) and the blade 21 to reach the anchoring position inside the reaction oven 1. In the present invention, the teaching tool 5 is to perform as a stop structure for maintaining solidly the correct position relationship among the reaction oven 1, the tray 4 and the robot arm 2. After the anchoring position is confirmed, a control system is used to memorize related coordinates for correctly locating the wafer in the following manufacturing process and then the robot arm 2 as well as the teaching tool 5 can be retrieved from the reaction oven 1. The calibration upon the robot arm 2 is complete after the teaching tool 5 is removed therefrom.

By providing the teaching tool 5 of the present invention, accurate calibration with multiple contact points, or say surface-to-surface contact, can be provided to blind teach the anchoring position of the robot arm 2 in a sealed wafer reaction oven 1 so as to reduce potential problems in yield reduction and cost up resulted from an ill-calibration to a minimum.

While the present invention has been particularly shown and described with reference to a preferred embodiment, it will be understood by those skilled in the art that various changes in form and detail may be without departing from the spirit and scope of the present invention.

We claim:

1. A teaching tool for a robot arm for wafer reaction ovens, as a unique piece for being applied while calibrating a robot arm to anchor the robot arm with a blade with respect to a tray located inside a reaction oven, comprising:

an upper flange having a width thereof to maintain a spacing between a handle of the robot arm and a door of the reaction oven while in calibration;

an insert block having a position width thereof to keep the teaching tool aligned with a center line of the tray by plugging a central passage of the tray;

a pair of lower flanges, for forming therebetween a lower tunnel aligning with the center line, the lower tunnel allowing the blade to contact closely and horizontally therefrom below and thus to maintain a position height between the blade and a floor of the reaction oven; and wherein, during calibration, the teaching tool is placed at an upper conjunction between the handle of the robot arm and the blade.

2. The teaching tool for a robot arm for wafer reaction ovens according to claim 1, wherein said lower tunnel is complementary in shape to said blade at said upper conjunction.

3. The teaching tool for a robot arm for wafer reaction ovens according to claim 1, wherein said upper flange has a rectangular cross section.

4. The teaching tool for a robot arm for wafer reaction ovens according to claim 1, wherein said insert block has a height equal to an internal height of said reaction oven.

5. The teaching tool for a robot arm for wafer reaction ovens according to claim 1, wherein said insert block further includes thereof a top surface for contacting with a ceiling of said reaction oven while in calibration.

6. The teaching tool for a robot arm for wafer reaction ovens according to claim 1, wherein said upper flange and said handle are surface-contacted and said upper flange and said door are also surface-contacted.

7. The teaching tool for a robot arm for wafer reaction ovens according to claim 1, wherein said teaching tool and said central passage of said tray are surface-contacted for maintaining said position width.

* * * * *